(12) United States Patent (10) Patent No.: US 8,697,542 B2
Pascual et al. (45) Date of Patent: Apr. 15, 2014

(54) METHOD FOR THIN DIE-TO-WAFER BONDING

(75) Inventors: Daniel Pascual, Wolcott, VT (US); Jeremiah Hebding, Poughkeepsie, NY (US); Megha Rao, Clifton Park, NY (US); Colin McDonough, Albany, NY (US); Douglas Duane Coolbaugh, Highland, NY (US); Joseph Piccirillo, Jr., Clifton Park, NY (US); Michael Liehr, Guilderland, NY (US)

(73) Assignee: The Research Foundation of State University of New York, Albany, NY (US)

( * ) Notice: Subject to any disclaimer, the term of this patent is extended or adjusted under 35 U.S.C. 154(b) by 3 days.

(21) Appl. No.: 13/445,550

(22) Filed: Apr. 12, 2012

(65) Prior Publication Data

US 2013/0273691 A1 Oct. 17, 2013

(51) Int. Cl.
 *H01L 21/30* (2006.01)
 *H01L 21/46* (2006.01)

(52) U.S. Cl.
 USPC ............................ 438/455; 438/107; 257/774

(58) Field of Classification Search
 USPC ................... 438/107, 455; 257/774
 See application file for complete search history.

(56) References Cited

U.S. PATENT DOCUMENTS

| | | | |
|---|---|---|---|
| 5,882,956 A | 3/1999 | Umehara et al. | |
| 6,007,920 A | 12/1999 | Umehara et al. | |
| 7,078,320 B2 | 7/2006 | Hsu et al. | |
| 7,547,625 B2 | 6/2009 | Beyne et al. | |
| 7,750,459 B2 | 7/2010 | Dang et al. | |
| 7,799,613 B2 | 9/2010 | Dang et al. | |
| 7,880,315 B2 | 2/2011 | Beyne et al. | |
| 7,883,991 B1 * | 2/2011 | Wu et al. ...................... | 438/459 |
| 7,897,481 B2 | 3/2011 | Chiou et al. | |
| 7,915,080 B2 | 3/2011 | Takahashi et al. | |
| RE42,349 E * | 5/2011 | Lin et al. .................... | 427/207.1 |

(Continued)

FOREIGN PATENT DOCUMENTS

WO 2013006865 A2 1/2013

OTHER PUBLICATIONS

Pargfrieder, Stefan et al., Temporary bonding/debonding for ultrathin substrates, http://www.electroiq.com/articles/sst/print/volume-51/issue-7/features/thin-wafer-processing/temporary-bonding-debonding-for-ultrathin-substrates.html, vol. 51, Issue 7, Jul. 2008.

*Primary Examiner* — Phuc Dang
(74) *Attorney, Agent, or Firm* — Heslin Rothenberg Farley & Mesiti P.C.

(57) ABSTRACT

A method is provided for bonding a die to a base technology wafer and includes: providing a device wafer having a front, back, at least one side, and at least one TSV, wherein the back contains a substrate material; providing a carrier wafer having a front, back, and at least one side; bonding the wafers using an adhesive; removing the substrate material and wet etching, from the device wafer's back side, to expose at least one metallization scheme feature; processing the device wafer's back side to create at least one backside redistribution layer; removing the device wafer from the carrier wafer; dicing the device wafer into individual die; providing a base technology wafer; coating the front of the base technology wafer with a sacrificial adhesive; placing the front of the individual die onto the front of the base technology wafer; and bonding the individual die to the base technology wafer.

18 Claims, 14 Drawing Sheets

(56) References Cited

U.S. PATENT DOCUMENTS

| | | |
|---|---|---|
| 7,951,647 B2 | 5/2011 | Yang et al. |
| 7,973,407 B2 | 7/2011 | Ramanathan et al. |
| 8,017,451 B2 | 9/2011 | Racz et al. |
| 8,035,233 B2 | 10/2011 | Leedy |
| 2009/0091016 A1* | 4/2009 | Li .................................. 257/690 |
| 2009/0218560 A1 | 9/2009 | Flaim et al. |
| 2009/0302394 A1 | 12/2009 | Fujita |
| 2010/0263794 A1 | 10/2010 | George et al. |
| 2010/0266373 A1 | 10/2010 | George et al. |
| 2010/0326702 A1 | 12/2010 | Dang et al. |
| 2011/0010908 A1 | 1/2011 | George et al. |
| 2011/0014774 A1 | 1/2011 | Johnson et al. |
| 2011/0025782 A1* | 2/2011 | Haluzak et al. .................. 347/50 |
| 2011/0069467 A1 | 3/2011 | Flaim et al. |
| 2011/0092030 A1 | 4/2011 | Or-Bach et al. |
| 2011/0108888 A1 | 5/2011 | Or-Bach et al. |
| 2011/0121366 A1 | 5/2011 | Or-Bach et al. |
| 2011/0253314 A1 | 10/2011 | George |
| 2011/0253315 A1 | 10/2011 | George |
| 2011/0260319 A1 | 10/2011 | Ramanathan et al. |
| 2011/0290415 A1* | 12/2011 | George .......................... 156/247 |
| 2011/0298137 A1* | 12/2011 | Pagaila et al. ................. 257/773 |
| 2012/0013013 A1 | 1/2012 | Sadaka et al. |
| 2013/0119552 A1* | 5/2013 | Lin et al. ....................... 257/774 |

* cited by examiner

METHOD FOR THIN DIE-TO-WAFER BONDING

BACKGROUND

The present disclosure relates generally to fabrication of integrated circuits, semiconductor devices and other miniaturized devices, and more particularly, to fabrication of three-dimensional integrated circuits using thin die-to-wafer bonding.

Currently, wire bonding is being used to make connections between chips. The wire bonds are long connections which slow down the speed at which the devices can talk to each other. In addition, the number of connections that can be made between devices is limited because wire bonding uses bonding sites around the perimeter of the die to make the connections and there are a limited number of sites on the perimeter. The minimum size of the semiconductor devices is also limited by the use of wire bonding. By replacing wire bonding with three-dimensional device integration, a larger number of connections are possible and those connections will be shorter which will speed up the time it takes for the devices to communicate with each other.

As semiconductor device sizes have decreased, three-dimensional device integration has become a desired method for increasing the density of integrated circuits and/or semiconductor devices. Three-dimensional integration occurs when a plurality of semiconductor die are vertically stacked having electrical contacts disposed on both the active surface and back-side of the dies thereby increasing the electrical interconnections between the stacked dies. Typically, the die to die electrical connections have been wire bonds that require a long connection which slows the speed and limits the number of possible connections. Also due to the ultra thin nature of the die, they are difficult to handle and susceptible to breakage and contamination. Further, it is important to be able to identify and employ only good, non-defective die in building a stack.

The present disclosure contemplates a new and improved method for fabrication of three-dimensional integrated circuits using thin die-to-wafer bonding that overcomes current limitations.

SUMMARY

In one aspect, provided herein is a novel method for bonding a die to a base technology wafer. The method includes: providing a device wafer having a front, a back, at least one side, and at least one through substrate via, wherein the back is comprised of a substrate material; providing a carrier wafer having a front, a back, and at least one side; bonding the front of the device wafer to the carrier wafer using an adhesive; removing, from the back of the device wafer, the substrate material; wet etching, from the back of the device wafer, to expose at least one feature made from a metallization scheme; processing the back of the device wafer to create at least one backside redistribution layer; removing the device wafer from the carrier wafer; dicing the device wafer into individual die; providing a base technology wafer having a front, a back, and at least one side; coating the front of the base technology wafer with a sacrificial adhesive; placing the front of the individual die onto the front of the base technology wafer; and bonding the individual die to the base technology wafer.

These, and other embodiments, objects, features and advantages of this invention will become apparent from the following detailed description of the various aspects of the invention taken in conjunction with the accompanying drawings and are considered a part of the claimed invention.

BRIEF DESCRIPTION OF DRAWINGS

The accompanying drawings, which are incorporated in and constitute a part of the specification, illustrate embodiments of the invention and together with the detailed description herein, serve to explain the principles of the invention. The drawings are only for purposes of illustrating preferred embodiments and are not to be construed as limiting the invention.

DETAILED DESCRIPTION

Figure 1:
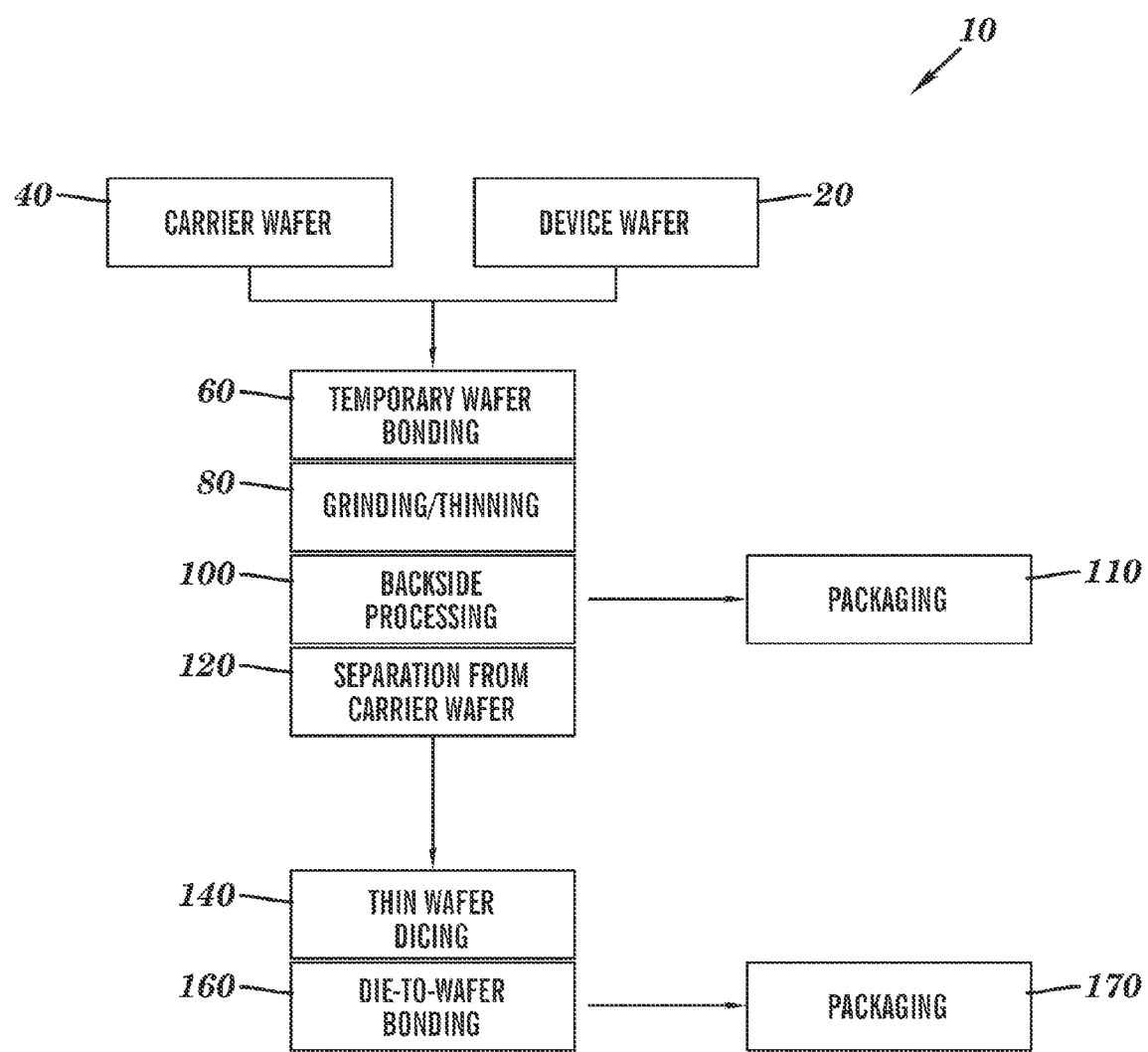
FIG. 1 depicts one embodiment of a process for bonding a die to a base technology wafer, in accordance with one or more aspects of the present invention.

Referring to the drawings, wherein like reference numerals are used to indicate like or analogous components or steps throughout the several views, and with particular reference to FIG. 1, there is illustrated an exemplary bonding process 10 for mounting a die to a base technology wafer. As used herein, the term "die" is used to refer to a small piece of semiconducting material which has been fabricated with a circuit, the term "base technology wafer" is used to refer to integrated circuits, semiconductor devices, and other miniaturized devices, including but not limited to CMOS, optoelectronics, infrared detectors, MEMS, and the like, the term "device wafer" is used to refer to a thin slice of semiconductor material used in the fabrication of integrated circuits, semiconductor devices, and other miniaturized devices, and the term "carrier wafer" is used to refer to a base carrier that provides support to the device wafer while it is processed and thinned.

A die may be mounted to a base technology wafer in accordance with one or more aspects of the present invention, by the bonding process 10 which includes the steps of providing a device wafer 20 and a carrier wafer 40, temporarily bonding the wafers 60, grinding and thinning the device wafer 80, processing the backside of the device wafer 100, separating the device wafer and carrier wafer 120, dicing the thin device wafer 140, and bonding the individual die to a base technology wafer 160. These individual steps are described in greater detail hereinafter. In addition, optional packaging steps 110 and 170 may be performed after the processing of the backside of the device wafer 100 and/or bonding of the individual die to a base technology wafer 160. Such packaging may include solder ball bumping, addition of bonding pads, wire bonding, and flip chip bonding.

Figure 2:
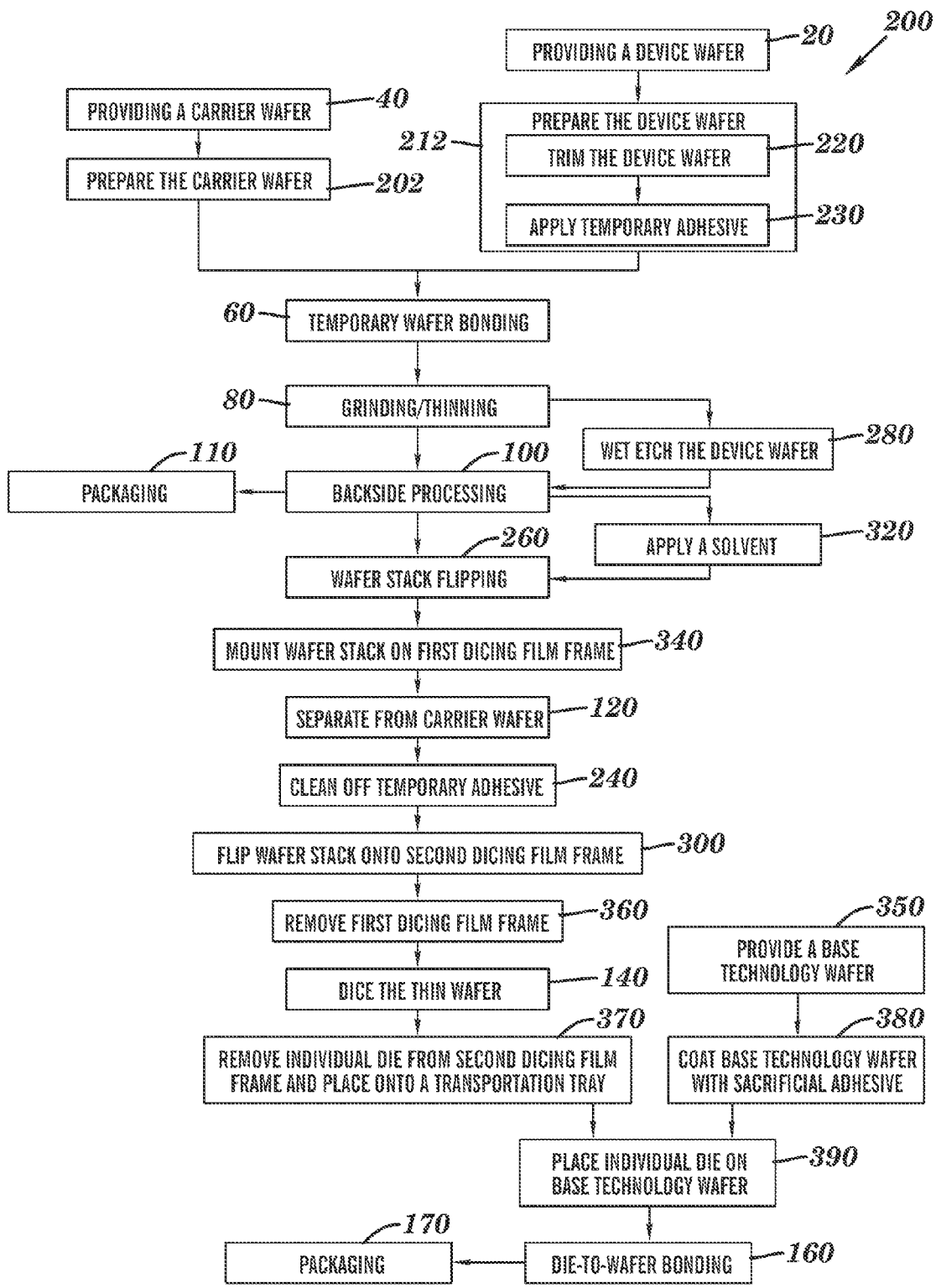
FIG. 2 depicts a second embodiment of the process for bonding a die to a base technology wafer, in accordance with one or more aspects of the present invention.

As seen in FIG. 2, a second exemplary bonding process 200 for mounting a die to a base technology wafer includes the steps of providing a device wafer 20 and a carrier wafer 40, preparing the carrier wafer 202, preparing the device wafer 212, which may include trimming the device wafer edge 220 and applying a temporary adhesive 230, temporarily bonding the wafers 60, grinding and thinning the device wafer 80, optionally wet etching the back side of the device wafer 280, processing the backside of the device wafer 100, applying a solvent to the temporary adhesive 320, flipping the device and carrier wafer stack 260, mounting the wafer stack to a first dicing film frame 340, separating the device wafer and carrier wafer 120, cleaning the temporary adhesive off the device wafer 240, optionally applying the wafer stack to a second dicing film frame 300, removing the first dicing film frame 360, dicing the thin device wafer 140, removing individual die from second dicing film frame and placing onto a transportation tray 370, providing a base technology wafer 350, coating the base technology wafer with a sacrificial adhesive 380, placing the individual die on the base technology wafer 390, and bonding the individual die to a base technology wafer 160. In addition, the optional packaging steps 110 and 170, seen in FIG. 1, may be performed in the bonding process 200. These individual steps are described in greater detail hereinafter.

Figure 3A:
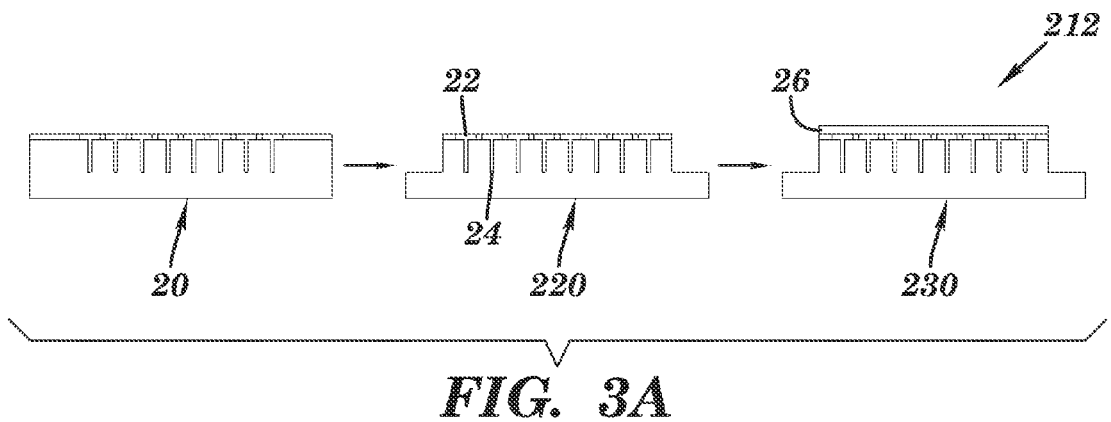
FIG. 3A depicts a cross-sectional view of the device wafer preparation steps of the processes of FIGS. 1 and 2, in accordance with one or more aspects of the present invention.
Figure 3B:
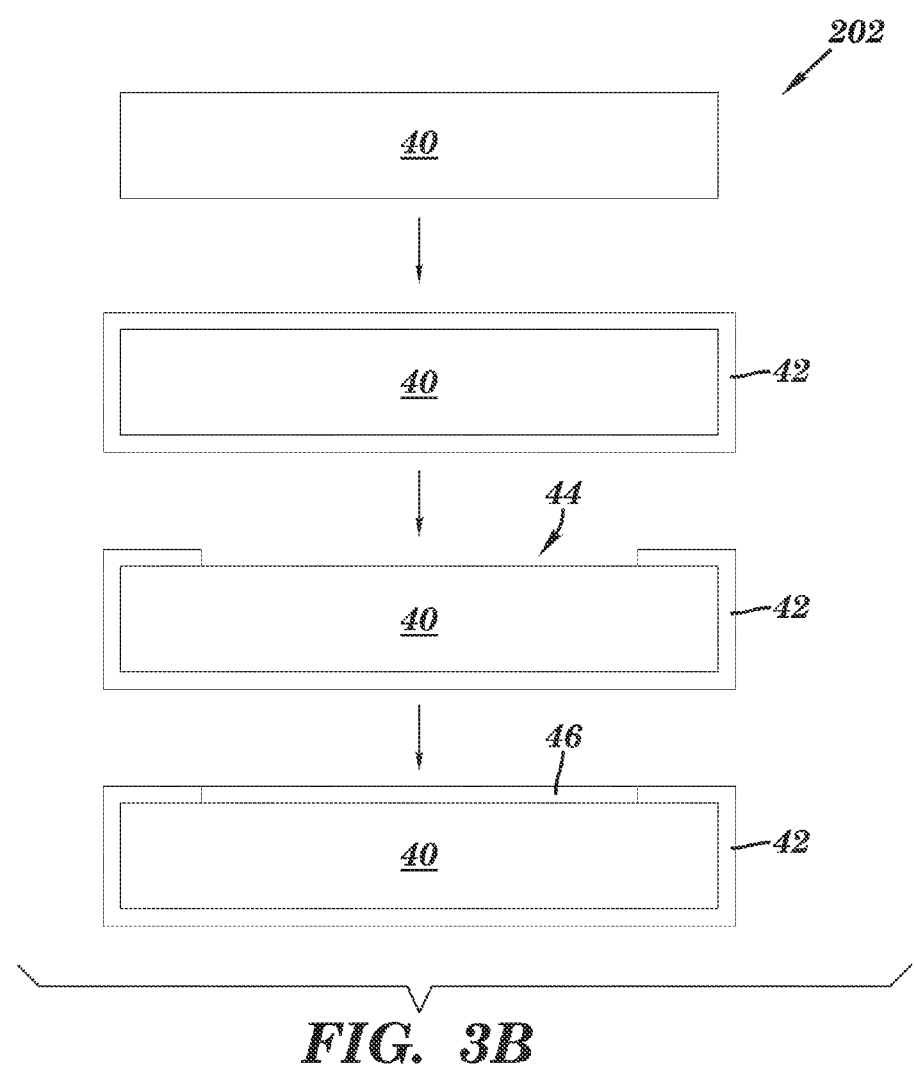
FIG. 3B depicts a cross-sectional view of the carrier wafer preparation steps of the processes of FIGS. 1 and 2, in accordance with one or more aspects of the present invention.

More particularly, as best seen in FIGS. 3A and 3B and referring to the bonding process 200 of FIG. 2, the exemplary steps of preparing the device wafer 212 and carrier wafer 202 are shown. The step of preparing the device wafer 212 includes obtaining a device wafer 20, which may, for example, have front side complementary metal-oxide semiconductors ("CMOS") 22 and through substrate vias ("TSVs") 24. Next, the front side edge of the device wafer 20 may be trimmed in step 220 by partially grinding the edge of the device wafer 20, in a manner known in the art. The trimmed device wafer 20 may then have a temporary adhesive layer 26 placed over its' front to allow for temporary bonding with the carrier wafer 40 in step 230. The temporary adhesive may comprise thermoplastic, thermal cure, and UV cure adhesives, and may be applied by spin coating, or other known techniques.

One method of preparing the carrier wafer 40 as described in step 202 is depicted in FIG. 3B and includes the carrier wafer 40 receiving a conformal coating 42, such as a silicon dioxide coating for a silicon wafer. Other coatings which serve to protect the carrier wafer from etching or any other damage, such as silicon nitride, aluminum oxide, or other passivating dielectrics, may be applied to the carrier wafer, which may comprise silicon, glass, quartz, or other materials. Coating 42 may be applied by chemical vapor deposition ("CVD"), plasma enhanced chemical vapor deposition ("PECVD"), physical vapor deposition ("PVD"), or other known techniques. Next, a channel 44 is formed in the coating 42 on the front of the carrier wafer 40 by selective etching or other known techniques. Channel 44 may, advantageously, have a shape and size to accommodate the device wafer 20, although other shapes and sizes are possible. The channel 44 may then be filled with a non-stick material 46 which creates a low-adhesion area in the center of the carrier wafer 40. The low-adhesion area allows for easier removal of the temporarily bonded device wafer 20. Examples of suitable non-stick materials include fluorocarbons, organic compounds, or any other chemical treatments creating a hydrophobic surface. Alternatively, a masking material may be applied to the outer perimeter of the front of the carrier wafer 40 and the center area of the front of the carrier wafer 40 may be chemically modified to reduce the adhesive properties of the wafer creating a low-adhesion area. This low-adhesion area created by chemically modifying the center of the carrier wafer 40 will also allow for easier removal of the temporarily bonded device wafer 20.

Figure 4A:
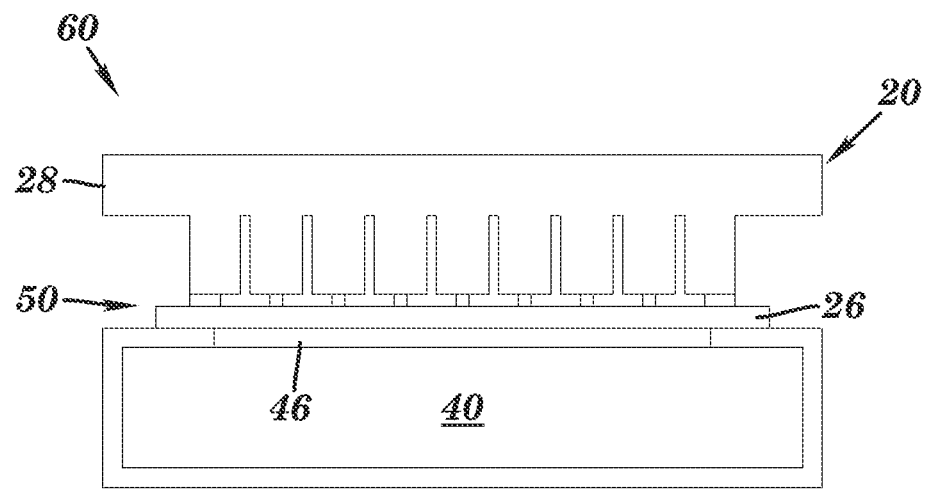
FIG. 4A depicts a cross-sectional view of the prepared device wafer bonded to the prepared carrier wafer, in accordance with one or more aspects of the present invention.

As depicted in FIG. 4A, the device wafer 20 is next temporarily bonded to the carrier wafer 40 in step 60. More particularly, the temporary adhesive layer 26 of the front of the device wafer 20 is aligned with the non-stick material 46 on the front of the carrier wafer 40. The temporary adhesive layer 26 extends slightly past the non-stick material 46 creating a non-stick area where the adhesive layer 26 contacts the non-stick material 46 and a high adhesion area at the outer perimeter of the wafers 20, 40 where the adhesive layer 26 contacts the coating 42. Then heat and force are applied to temporarily bond the device wafer 20 to the carrier wafer 40. For example, a temporary wafer bond may be formed using 250° C. temperature, 16 kN of force, for 5 minutes using a thermoplastic adhesive in a commercial wafer bonding tool. It is also contemplated that the temporary adhesive layer 26 may be applied over the non-stick material 46 on the front of the carrier wafer 40 prior to alignment of the device wafer 20 and carrier wafer 40. The bonded device wafer 20 and carrier wafer 40 create a wafer stack 50. By temporarily bonding the device wafer 20 onto the carrier wafer 40, the device wafer 20 is provided the necessary support in order to allow for thinning and processing of the device wafer 20 without breaking, warping or folding of the device wafer 20.

Figure 4B:
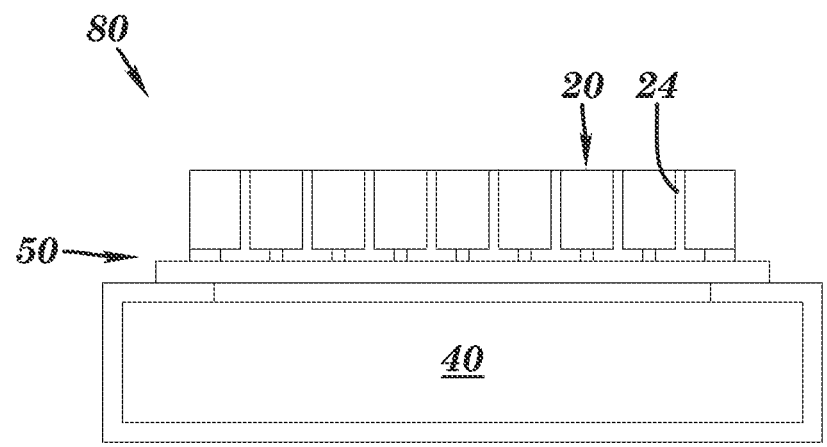
FIG. 4B depicts a cross-sectional view of the device wafer bonded to the carrier wafer after the removal of the substrate material from the back side of the device wafer, in accordance with one or more aspects of the present invention.
Figure 4C:
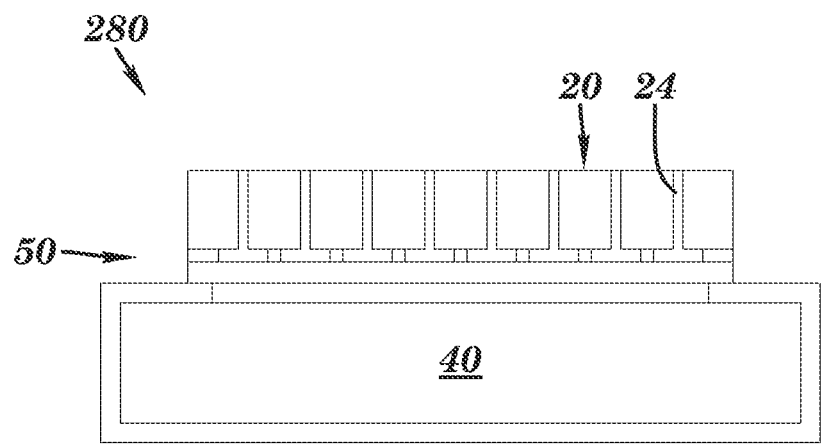
FIG. 4C depicts a cross-sectional view of the device wafer bonded to the carrier wafer after the wet etching step, in accordance with one or more aspects of the present invention.
Figure 4D:
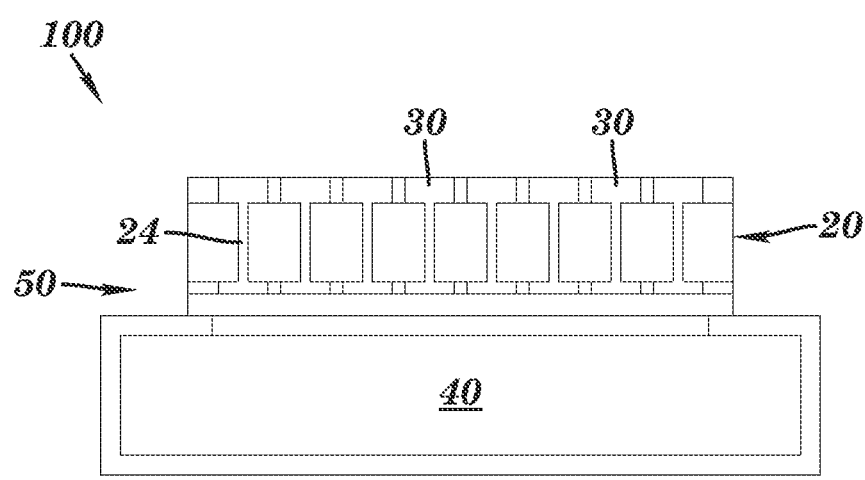
FIG. 4D depicts a cross-sectional view of the device wafer bonded to the carrier wafer after the backside processing step, in accordance with one or more aspects of the present invention.

Next, as seen in FIG. 4B, a grinding and thinning step 80 removes the substrate material 28 from the back of the device wafer 20 so that approximately 60 um of material remains. For example, a grinding wheel may be used to remove the substrate material 28 and thin the device wafer 20, in known fashion. Referring now to FIG. 4C, the bonding process for mounting a die to a base technology wafer may optionally include wet etching 280 the back side of the device wafer 20 to reveal the TSVs 24 or other features made from a metallization scheme. This wet etching may comprise chemicals such as hydrofluoric acid, tetramethylammonium hydroxide, or potassium hydroxide. Next, as seen in FIG. 4D, a backside processing step 100 is performed to create redistribution layers and bump pads 30 on the back side of the device wafer 20. Examples of such backside processing include metal and dielectric deposition, patterning using photolithography, chemical mechanical planarization ("CMP"), and etching.

Figure 5A:
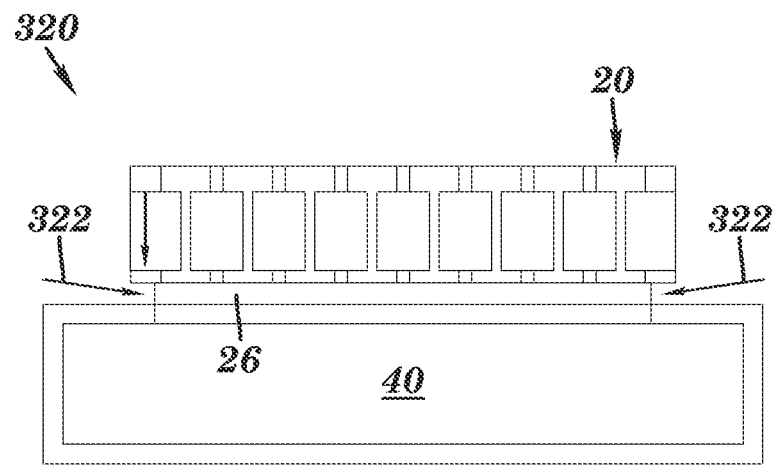
FIG. 5A depicts a cross-sectional view of the step of providing a solvent to the bonding layer between the device wafer and the carrier wafer to dissolve the adhesive, in accordance with one or more aspects of the present invention.

Referring now to FIGS. 5A-D, the step 120 of separating the device wafer 20 from the carrier wafer 40 is depicted. In order to prepare for separation of the device wafer 20 from the carrier wafer 40, as depicted in FIG. 5A, a solvent 322 may optionally be applied in step 320 to the temporary adhesive layer 26 to dissolve the temporary adhesive 26 back to the non-stick material 46 on the carrier wafer 40. The solvent 322 may be used to more easily separate the device wafer 20 from the carrier wafer 40. Exemplary solvents include limonene, acetone, N-methylpyrrolidone ("NMP"), mesitylene, methyl ethyl ketone ("MEK"), or trimethyl benzene.

Figure 5B:
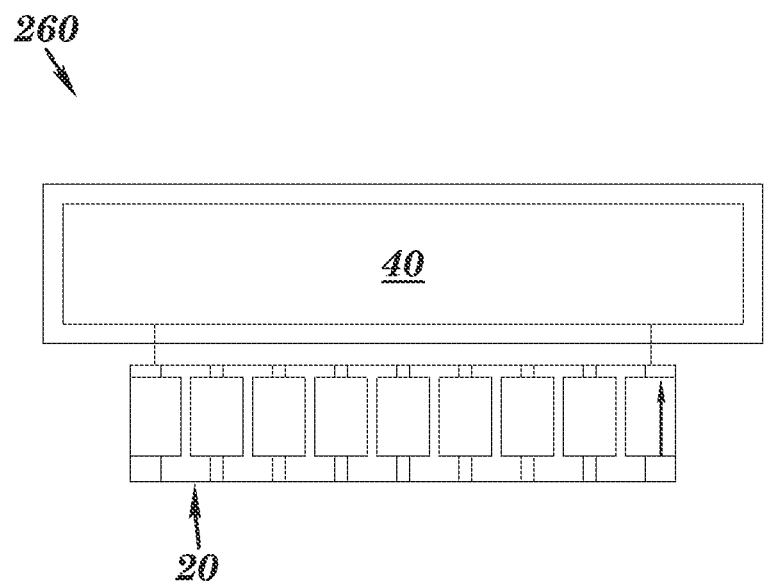
FIG. 5B depicts a cross-sectional view of the device wafer bonded to the carrier wafer flipped into position for mounting to a dicing film frame for removal of the carrier wafer, in accordance with one or more aspects of the present invention.
Figure 5C:
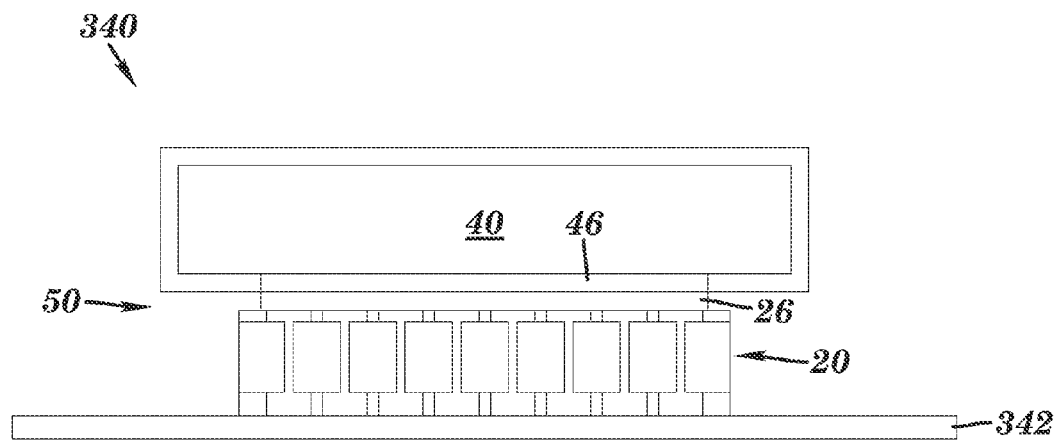
FIG. 5C depicts a cross-sectional view of the device wafer bonded to the carrier wafer and mounted to a dicing film frame for removal of the carrier wafer, in accordance with one or more aspects of the present invention.
Figure 5D:
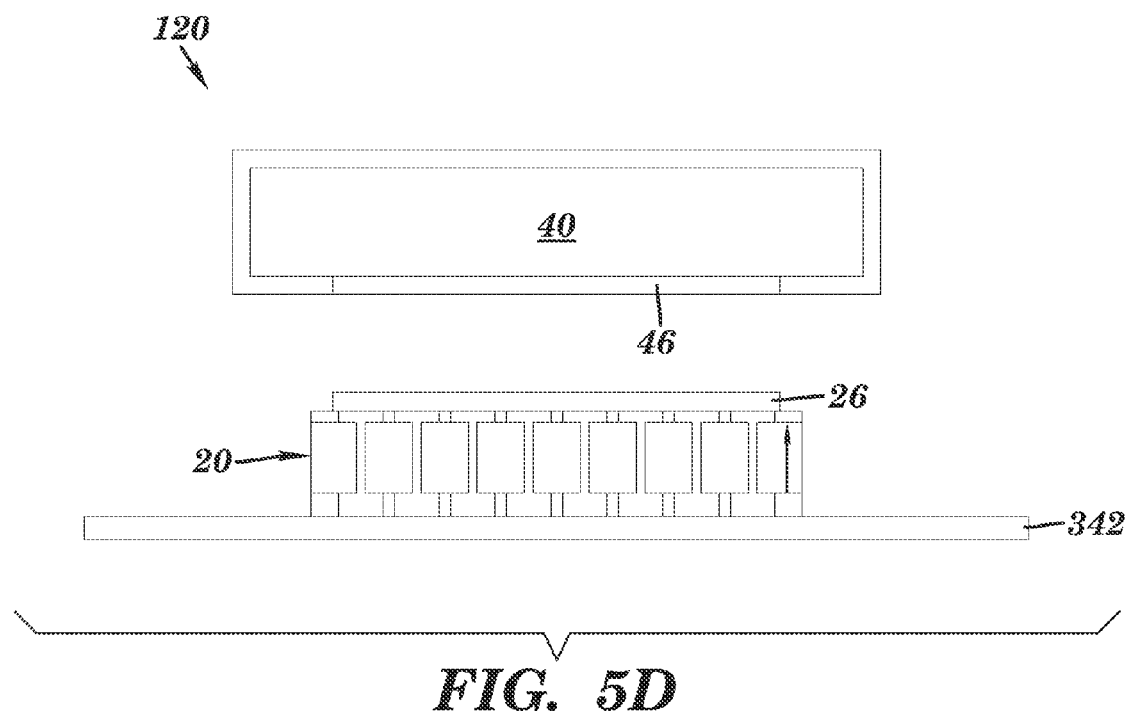
FIG. 5D depicts a cross-sectional view of the carrier wafer removal from the device wafer, in accordance with one or more aspects of the present invention.

Referring now to FIG. 5B, step 260 is depicted showing the wafer stack 50 flipped into the preferred orientation for removal of the carrier wafer 40 in this exemplary process. The wafer stack 50 is then mounted from the back side of the device wafer 20 onto a first dicing film frame 342, as best seen in FIG. 5C. The first dicing film frame 342 may comprise a UV sensitive dicing film and standard dicing frame which serves to provide an adhesive surface to hold the device wafer 20 in place during removal of the carrier wafer, but which also allows for easy removal of the device wafer after the carrier wafer has been removed. Next, the separation step 120, depicted in FIG. 5D, is performed to remove the carrier wafer 40 from the device wafer 20. The carrier wafer 40 may be removed from the device wafer 20 using vacuum chucks, not shown, or other known separating mechanisms.

Once the carrier wafer 40 is removed from the device wafer 20, it is contemplated that the next step may be for the device wafer 20 to be diced into individual die. If the device wafer 20 is diced while tacked onto the first dicing film frame 342, then the first dicing film frame 342 provides an adhesive surface to hold the device wafer 20 in place during dicing, but also allows for easy removal of the individual die after dicing.

Figure 6A:
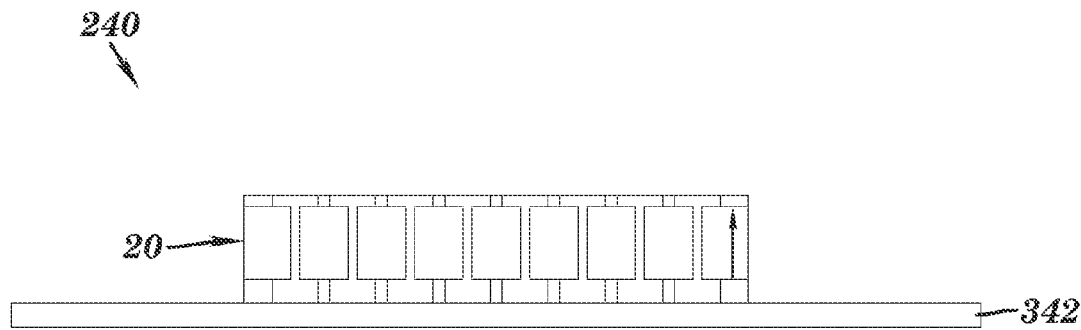
FIG. 6A depicts a cross-sectional view of the device wafer mounted to a first dicing film frame for cleaning of the adhesive from the device wafer, in accordance with one or more aspects of the present invention.
Figure 6B:
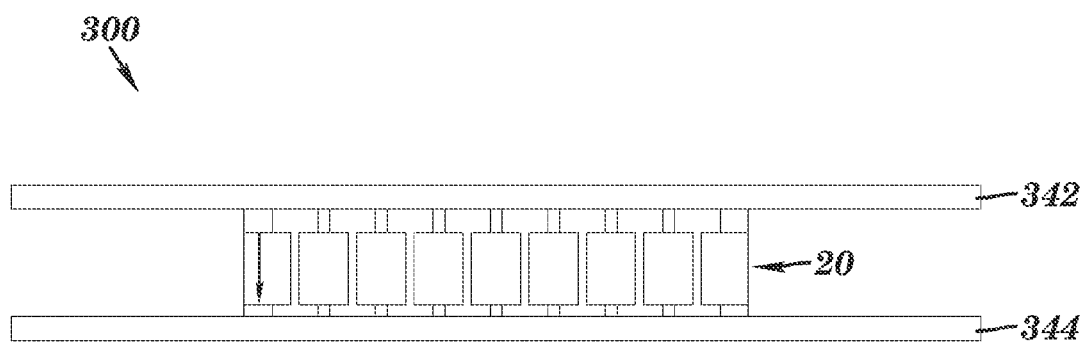
FIG. 6B depicts a cross-sectional view of the device wafer mounted to a second dicing film frame for flipping the device wafer into proper orientation for dicing, in accordance with one or more aspects of the present invention.
Figure 6C:
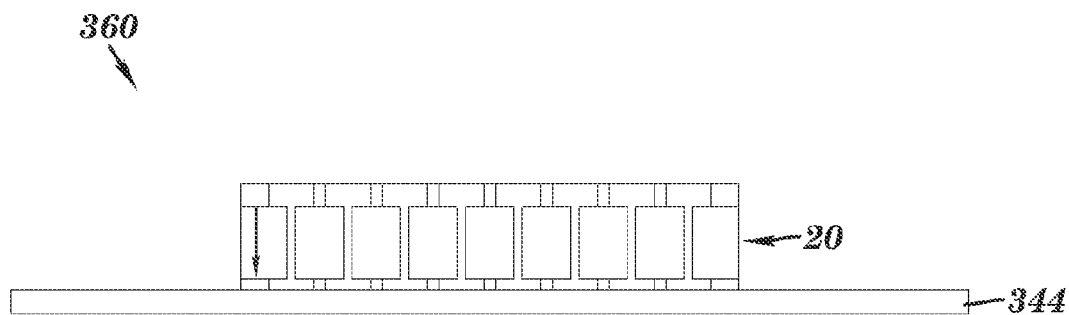
FIG. 6C depicts a cross-sectional view of the device wafer mounted to the second dicing film frame whereby the first dicing film frame has been removed, in accordance with one or more aspects of the present invention.
Figure 6D:
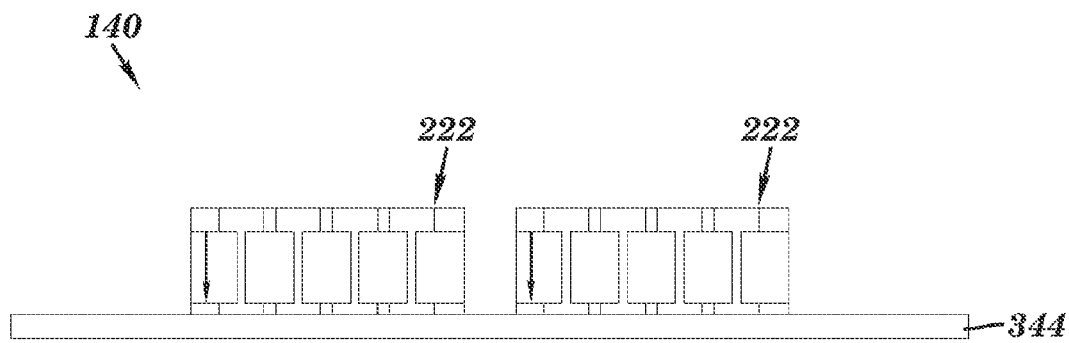
FIG. 6D depicts a cross-sectional view of the device wafer diced into two individual dies, in accordance with one or more aspects of the present invention.
Figure 6E:
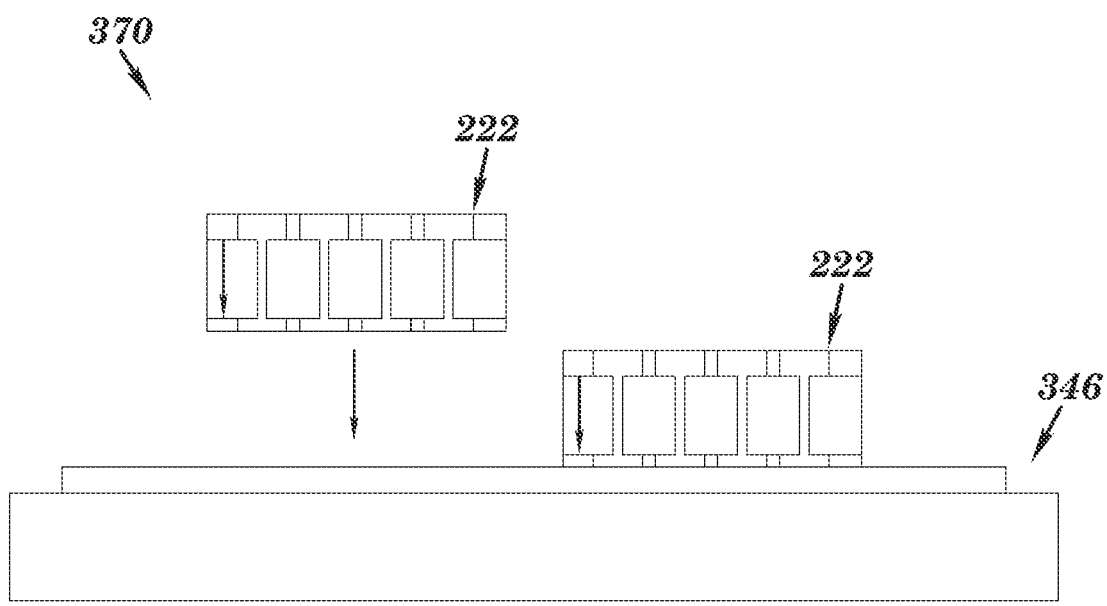
FIG. 6E depicts a cross-sectional view of the individual dies being removed from the second dicing film frame and placed onto a transport tray, in accordance with one or more aspects of the present invention.

FIGS. 6A-E, illustrate the optional steps of cleaning the temporary adhesive off the device wafer 240, applying the wafer stack to a second dicing film frame to flip the wafer stack 300, and removing the first dicing film frame 360, as well as the step of dicing the thin wafer 140. As best seen in FIG. 6A, the top surface of the device wafer 20 is cleaned to remove any adhesive that is still present on the device wafer 20 after removal of the carrier wafer 40. The cleaning step may, for example, comprise solvent clean. The thinned device wafer 20 is then applied to a second dicing film frame 344, e.g. a standard dicing tape and frames, which serves to provide an adhesive surface to hold the device wafer in place during dicing, but which also allows for easy removal of the individual die after dicing. In the preferred embodiment, as illustrated in FIG. 6B, the device wafer 20 is flipped over and the front side of device wafer 20 is mounted onto the second dicing film frame 344. FIG. 6C illustrates removal of the first dicing film frame 342 from the device wafer 20 leaving the device wafer 20 mounted on the second dicing film frame 344 in the proper orientation for dicing. As depicted in FIG. 6D, the thinned device wafer 20 is then diced, in conventional fashion, into individual die 222. The good individual die 222 are then individually removed from the second dicing film frame 344 and may be placed into a transport tray 346, such as a gel pack, (FIG. 6E) for transporting the individual die 222 to be mounted on a base technology wafer 350 as depicted in step 370. The transport tray 346 may include a gel-like material providing a low tack adhesion to hold the individual die 222 in place during shipping.

Figure 7A:
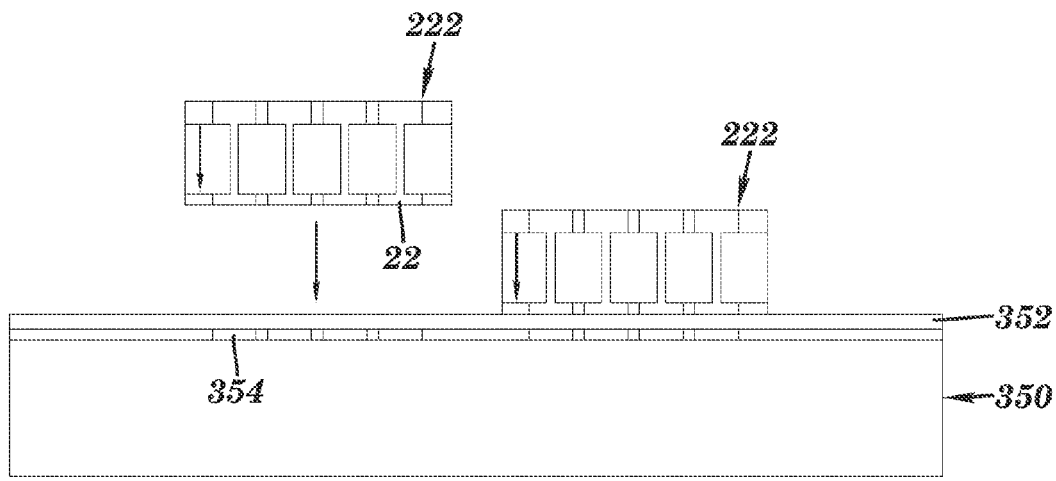
FIG. 7A depicts a cross-sectional view of the individual dies being removed from the transport tray and placed onto a base technology wafer treated with a sacrificial adhesive, in accordance with one or more aspects of the present invention.
Figure 7B:
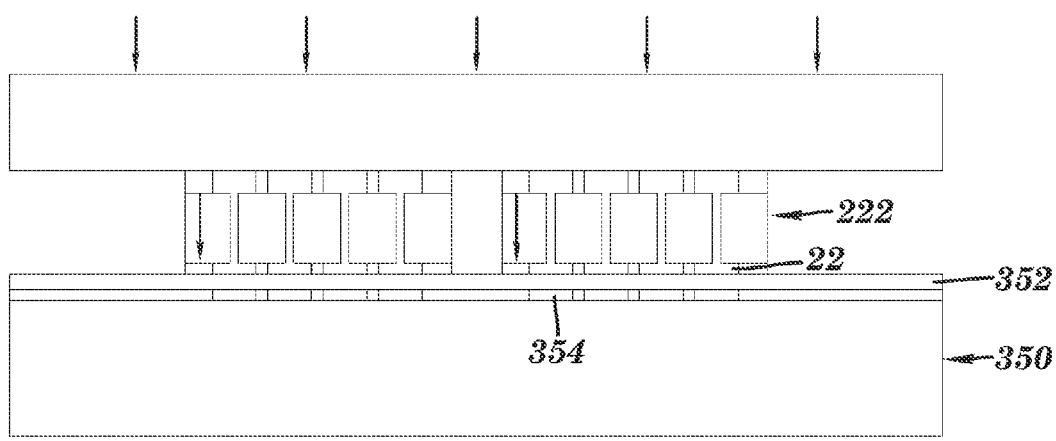
FIG. 7B depicts a cross-sectional view of the step of bonding the individual die to the base technology wafer, in accordance with one or more aspects of the present invention.
Figure 7C:
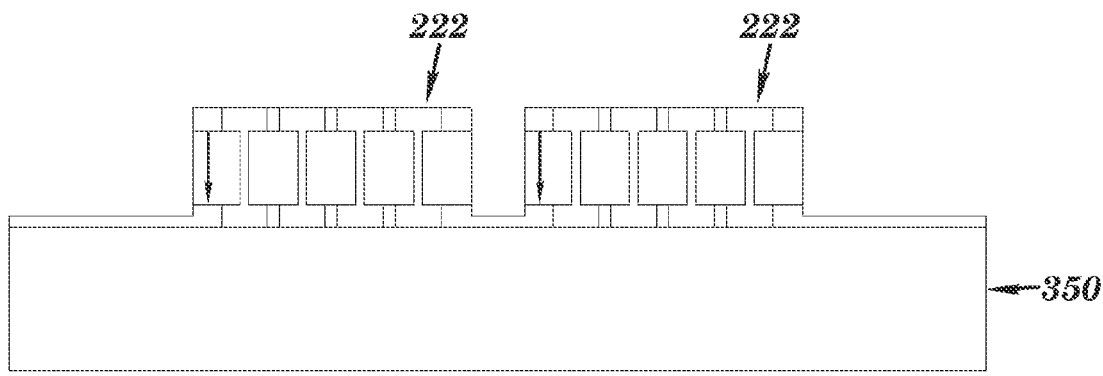
FIG. 7C depicts a cross-sectional view of the individual die bonded to the base technology wafer whereby the sacrificial adhesive has evaporated, in accordance with one or more aspects of the present invention.

The step 160 of bonding the individual die 222 to a base technology wafer 350 is depicted in FIGS. 7A-7D. As illustrated in FIGS. 7A and 7B, the bonding step 160 may include the step 380 of applying, for example, by spin coating, a sacrificial adhesive 352 to the top of the base technology wafer 350. The sacrificial adhesive 352 may be a thermally decomposable adhesive that breaks down at elevated temperatures, evaporating very cleanly and leaving very little residue behind, e.g. sacrificial adhesives produced by Novermer, Promerus, Sumitomo Bakelite, and other. Then the individual die 222 may be removed from the transport tray 346 for mounting onto the base technology wafer 350. It is also contemplated that the sacrificial adhesive 352 may be applied to the individual die 222 after removal from the transport tray 346, rather than to the base technology wafer 350, prior to the individual die 222 being placed onto the base technology wafer 350. Once the sacrificial adhesive 352 has been applied, the CMOS 22 of the individual die 222 are then aligned and tacked onto the base technology wafer 350 at contacts 354, as seen in step 390. The sacrificial adhesive 352 provides a low temperature bond to hold the individual die 222 in proper alignment on the base technology wafer 350 during the bonding process. Once each of the individual die 222 to be bonded to the base technology wafer 350 have been aligned and tacked into place, the base technology wafer 350 with the tacked individual die 222 may be placed into a wafer bonder, not shown, to complete the bonding at an elevated temperature. As best seen in FIG. 7B, a global application of heat and force is applied by the wafer bonder to each of the individual die 222. The application of heat and force removes the sacrificial adhesive 352 from the base technology wafer 350 and then creates the metal to metal bond between the CMOS 22 of the individual die 222 and the contacts 354 of the base technology wafer 350, as depicted in FIG. 7C. The metal to metal bonds may be copper to copper bonds, or employ other metals. Known bonding techniques such as compression bonding, thermo-compression bonding, ultrasonic bonding, fusion bonding, and soldering can be utilized to bond the individual die to the base technology wafer.

Figure 7D:
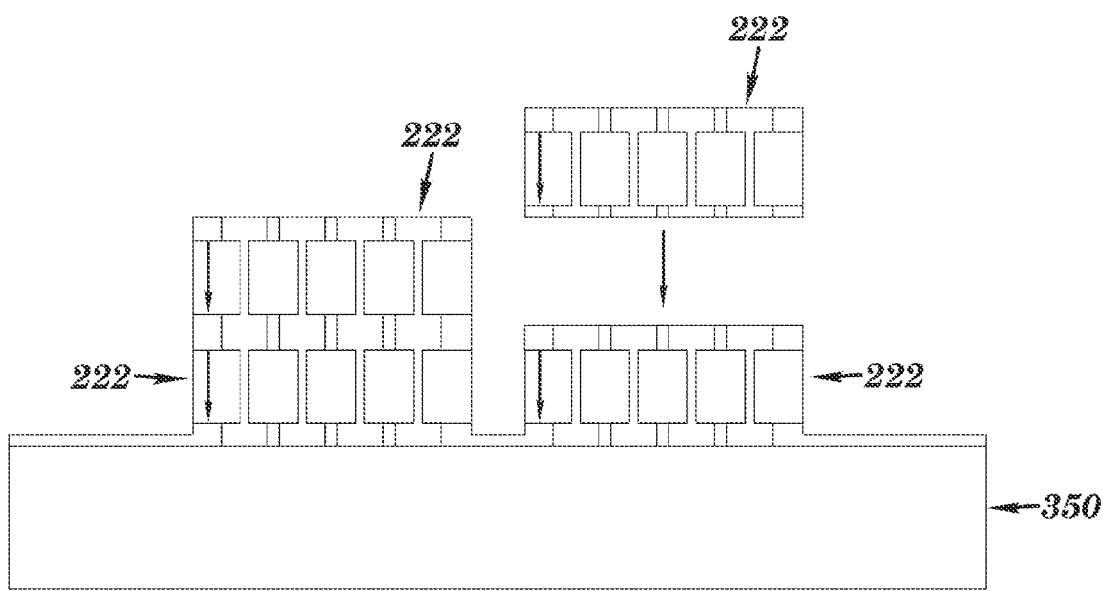
FIG. 7D depicts a cross-sectional view of a second layer of individual die being bonded to the first layer of individual die to create a three-dimensional stack, in accordance with one or more aspects of the present invention.

Referring now to FIG. 7D, a base technology wafer 350 having two layers of individual die 222 being bonded to the base technology wafer 350 to create a three-dimensional integrated circuit is shown. The second layer of individual die 222 may be bonded to the first layer of individual die 222 as described above in step 160. Additional layers of individual die 222 may be added to the three-dimensional integrated circuit as desired. The additional layers of individual die 222 are possible because the thin individual die 222 make available wiring points, contact pads, or other metallization schemes, such as TSVs, on the backside of the individual dies 222.

Various improved die to base technology wafer bonding approaches, that may optionally be used to supplement the above described die handling and bonding process, will now be described.

Figure 8:
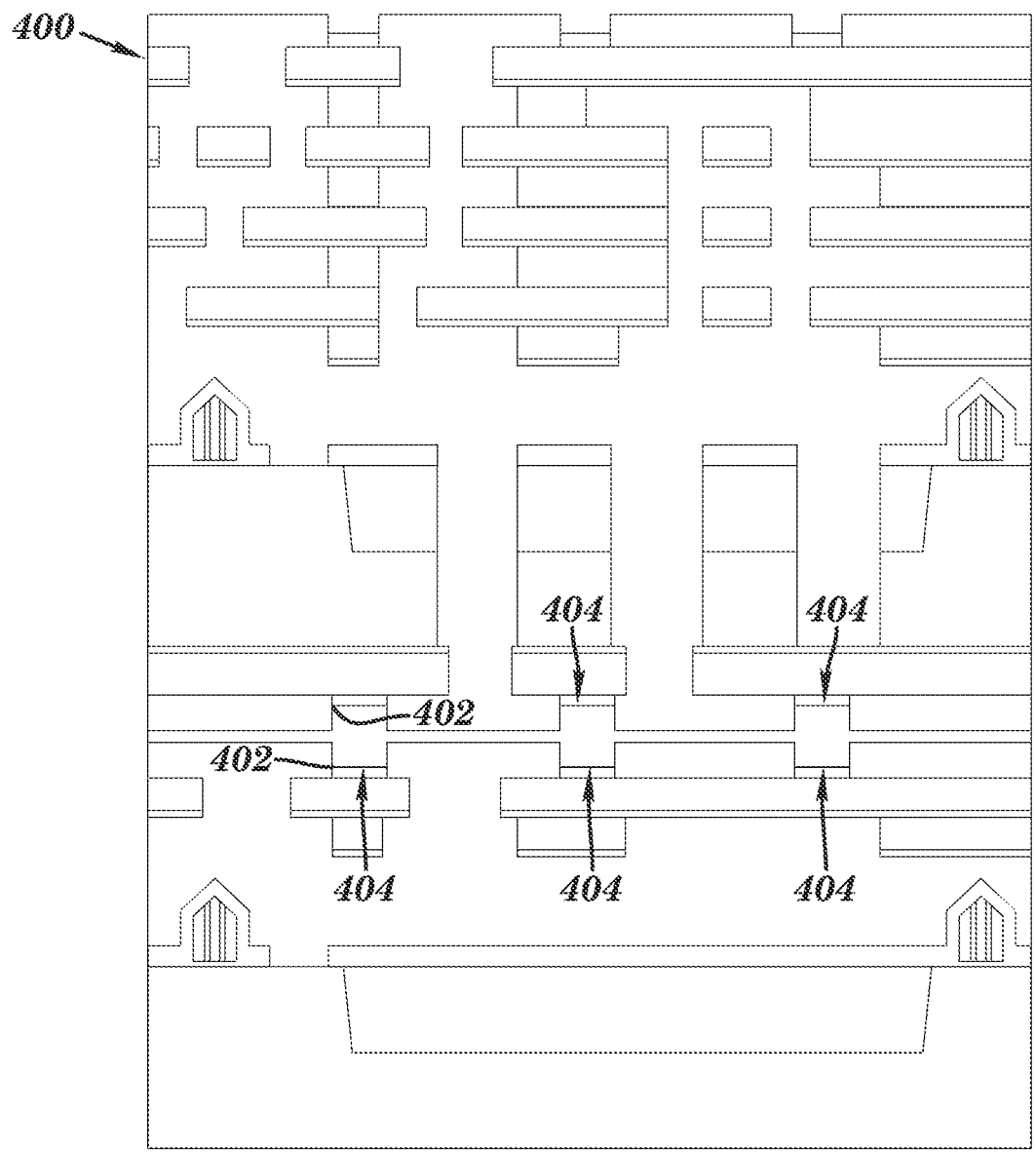
FIG. 8 depicts a cross-sectional view of the step of removing an oxide layer off of the bond pads on the individual die and the base technology wafer prior to bonding the individual die and the base technology wafer, in accordance with one or more aspects of the present invention.

Depicted in FIG. 8 is a three-dimensional integrated circuit 400. The integrated circuit 400 was formed using an alternative method of preparing the wafers for bonding. This method includes using a wet etch to remove the dielectrics 402 around the bond pads 404, which may be copper, aluminum, gold, nickel, solder, or the like, to allow for more reliable direct bonding of the bond pads. By removing the dielectrics 402 around the bond pads 404 prior to bonding the bond pads 404 it is possible to create a high yielding and reliable bond and interface.

Figure 9:
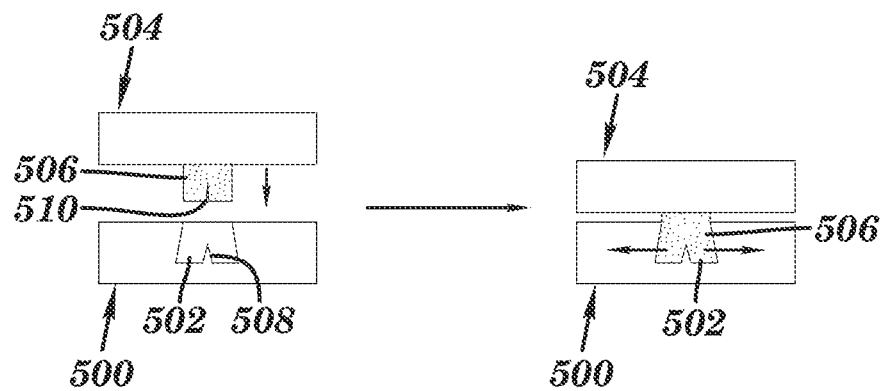
FIG. 9 depicts a cross-sectional view of a method of creating a permanent individual die and wafer bond, in accordance with one or more aspects of the present invention.

FIG. 9 illustrates a lock and key or dovetail type bonding pad, which may be bonded using compression bonding. The lock and key or dovetail type bonding pad include a lock 502 in a first wafer 500 and key 506 in a second wafer 504. When force is applied to the first wafer 500 and the second wafer 504 an irreversible bond is created between the lock 502 and key 506. As shown in FIG. 9, the lock 502 may include a cavity having a wedge 508 at the bottom of the cavity (sometimes referred to as a blind wedge) cooperating with a key 506 comprising a raised pad having a slit 510 in the bottom to enable the wedge 508 when force is applied to separate the key 506 into the cavity of the lock 502 creating the irreversible bond. Alternative lock and key structures, such as stars, crosses, or the like are also contemplated.

Figure 10:
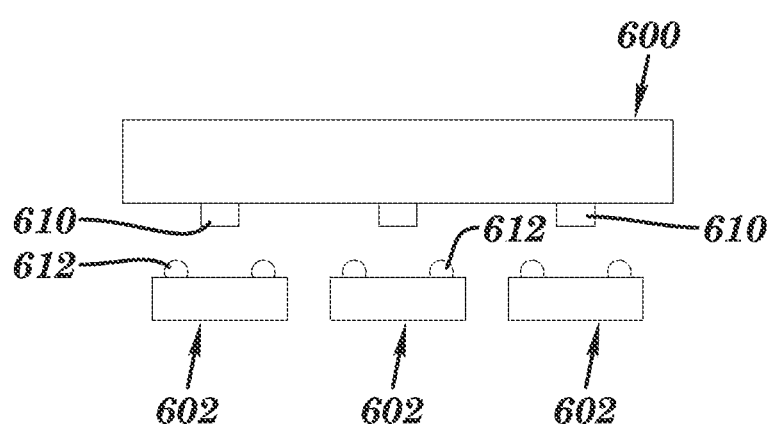
FIG. 10 depicts a cross-sectional view of the individual die and a wafer having solder bumps for bonding, in accordance with one or more aspects of the present invention.

Special tooling 600 may be employed to enable the three-dimensional integration and bonding of dies 602 which have solder bumps 612 as shown in FIG. 10. The face of the bonding tool 600 would contain raised features 610 to selectively apply force to the dies 602 during bonding without contacting and potentially damaging solder balls 612. The material used for the raised features 610 may be chosen to allow some amount of compliance to facilitate uniform application of force across multiple dies. Example materials include but are not limited to copper, graphite, or polymers.

The thin die-to-wafer bonding processes 10 and 200 provide a number of advantages over currently used bonding methods including, but not limited to, the ability to integrate devices from different technologies, e.g., CMOS, optoelectronics, MEMS, and other microelectronic devices, to provide new and/or improved capabilities. In addition, the yield of the resulting devices may be increased by incorporating only known-good die into the devices and thereby avoiding stacking yield loss, which decreases the overall costs. Furthermore, the ability to bond thin dies allows for the stacking of multiple device layers, including those from different technologies, connected vertically utilizing TSVs while maintaining a low-profile package. The bonding processes 10 and 200 also combine the existing tooling and materials to create a new process for high-volume production and packaging of stacked three dimensional integrated circuit devices. In addition, the bonding processes 10 and 200 create a robust interconnect operation over an extended period of time and harsh conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has", and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The invention has been described with reference to the preferred embodiments. It will be understood that the architectural and operational embodiments described herein are exemplary of a plurality of possible arrangements to provide the same general features, characteristics, and general system operation. Modifications and alterations will occur to others upon a reading and understanding of the preceding detailed description. It is intended that the invention be construed as including all such modifications and alterations.

Having thus described the preferred embodiments, the invention is now claimed to be:

1. A method of bonding a die to a base technology wafer, comprising:
   providing a device wafer having a front, a back, at least one side, and at least one through substrate via, wherein the back is comprised of a substrate material;
   providing a carrier wafer having a front, a back, and at least one side;
   preparing the carrier wafer for temporary bonding to the device wafer, comprising:
      applying a masking material to an outer perimeter of the front of the carrier wafer; and
      chemically modifying a center area of the front of the carrier wafer to reduce the adhesive properties of the carrier wafer;
   preparing the device wafer for temporary bonding to the carrier wafer, comprising:
      trimming an area around a perimeter of the front of the device wafer; and
      applying a temporary adhesive coating to the front of the device wafer;

bonding the front of the device wafer to the carrier wafer using an adhesive;

removing, from the back of the device wafer, the substrate material;

wet etching, from the back of the device wafer, to expose at least one feature made from a metallization scheme;

processing the back of the device wafer to create at least one backside redistribution layer;

removing the device wafer from the carrier wafer;

dicing the device wafer into individual die;

providing a base technology wafer having a front, a back, and at least one side;

coating the front of the base technology wafer with a sacrificial adhesive;

placing the front of the individual die onto the front of the base technology wafer; and bonding the individual die to the base technology wafer.

2. The method of claim 1, wherein preparing the device wafer comprises:

trimming an area around a perimeter of the front of the device wafer.

3. The method of claim 2, wherein preparing the carrier wafer comprises:

applying a masking material to the outer perimeter of the front of the carrier wafer;

chemically modifying the center area of the front of the wafer to reduce the adhesive properties of the wafer; and applying a temporary adhesive coating to the front of the carrier wafer.

4. The method of claim 2, wherein preparing the carrier wafer comprises:

applying a masking material to the outer perimeter of the front of the carrier wafer; and chemically modifying the center area of the front of the wafer to reduce the adhesive properties of the wafer.

5. The method of claim 1, wherein the front of the device wafer is bonded to the front of the carrier wafer using heat and force to activate the adhesive.

6. The method of claim 1, further comprising:

flipping the bonded device wafer and carrier wafer to mount onto a first dicing film frame.

7. The method of claim 1, wherein the bonding of the individual die to the base technology wafer is selected from compression bonding, thermo-compression bonding, ultrasonic bonding, fusion bonding, and soldering.

8. The method of claim 1, further comprising:

cleaning the device wafer to remove the adhesive.

9. The method of claim 1, further comprising:

placing the individual die into a gel pack.

10. The method of claim 9, further comprising:

removing the individual die from the gel pack before placing the individual die onto the front of the base technology wafer.

11. The method of claim 1, wherein the sacrificial adhesive is a thermally decomposable adhesive.

12. The method of claim 1, further comprising:

stacking additional individual die onto the individual die bonded to the base technology wafer to create a multi-chip stack.

13. A method of bonding a die to a base technology wafer, comprising:

providing a device wafer having a front, a back, at least one side, and at least one through substrate via, wherein the back is comprised of a substrate material;

providing a carrier wafer having a front, a back, and at least one side;

bonding the front of the device wafer to the carrier wafer using an adhesive;

removing, from the back of the device wafer, the substrate material;

wet etching, from the back of the device wafer, to expose at least one feature made from a metallization scheme;

processing the back of the device wafer to create at least one backside redistribution layer;

removing the device wafer from the carrier wafer, comprising applying a solvent to dissolve the adhesive; and mounting the back of the device wafer on a first dicing film frame to hold the device wafer during removal from the carrier wafer;

applying the device wafer to a second dicing film frame; and removing the first dicing film frame;

dicing the device wafer into individual die;

providing a base technology wafer having a front, a back, and at least one side;

coating the front of the base technology wafer with a sacrificial adhesive;

placing the front of the individual die onto the front of the base technology wafer; and bonding the individual die to the base technology wafer.

14. The method of claim 13, wherein applying the device wafer to the second dicing film frame comprises placing the device wafer in a correct orientation for dicing the device wafer into individual die.

15. A method of bonding a die to a base technology wafer, comprising:

providing a device wafer having a front, a back, at least one side, and at least one through substrate via, wherein the back is comprised of a substrate material;

providing a carrier wafer having a front, a back, and at least one side;

bonding the front of the device wafer to the carrier wafer using an adhesive;

removing, from the back of the device wafer, the substrate material;

wet etching, from the back of the device wafer, to expose at least one feature made from a metallization scheme;

processing the back of the device wafer to create at least one backside redistribution layer;

removing the device wafer from the carrier wafer:

dicing the device wafer into individual die;

providing a base technology wafer having a front, a back, and at least one side;

coating the front of the base technology wafer with a sacrificial adhesive;

placing the front of the individual die onto the front of the base technology wafer;

bonding the individual die to the base technology wafer; and coating the individual die with a sacrificial adhesive before placing the individual die onto the front of the base technology wafer.

16. The method of claim 15, wherein the bonding applies heat and force to the individual die and the base technology wafer to evaporate the sacrificial adhesive layer and create a metal to metal bond between at least one bond pad on the individual die and at least one bond pad on the base technology wafer.

17. The method of claim 16, wherein the at least one bond pad on the individual die and the at least one bond pad on the base technology wafer are selected from copper, aluminum, gold, nickel, and solder.

18. The method of claim 17, further comprising:
  removing an oxide layer off of the at least one bond pad on the individual die and/or the at least one bond pad on the base technology wafer prior to bonding the individual die and the base technology wafer.

\* \* \* \* \*